United States Patent
Kumatoriya et al.

(10) Patent No.: US 6,525,447 B2
(45) Date of Patent: Feb. 25, 2003

(54) METHOD FOR MANUFACTURING A LANGASITE SINGLE CRYSTAL SUBSTRATE, A LANGASITE SINGLE CRYSTAL SUBSTRATE, AND A PIEZOELECTRIC DEVICE

(75) Inventors: Makoto Kumatoriya, Omihachiman (JP); Jun Nakanishi, Shiga-ken (JP); Masashi Omura, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 206 days.

(21) Appl. No.: 09/758,819

(22) Filed: Jan. 11, 2001

(65) Prior Publication Data

US 2001/0009341 A1 Jul. 26, 2001

(30) Foreign Application Priority Data

Jan. 13, 2000 (JP) ........................................ 2000-004879

(51) Int. Cl.[7] ............................................. H01L 41/187
(52) U.S. Cl. ................... 310/313 R; 310/358; 29/25.35
(58) Field of Search ............................ 310/313 R, 358; 29/25.35

(56) References Cited

U.S. PATENT DOCUMENTS 5,496,485 A * 3/1996 Maternaghan .............. 252/79.3
5,605,490 A * 2/1997 Laffey et al. .................. 216/52

FOREIGN PATENT DOCUMENTS

| JP | 7-50537 | | 2/1995 | ............ H03H/3/02 |
| JP | 7-176525 | * | 7/1995 | ......... H01L/21/308 |
| JP | 10-93369 | | 4/1998 | ............ H03H/3/08 |
| JP | 10-13759 | | 5/1998 | ............ H03H/3/02 |
| KR | 2001077228 | * | 8/2001 | ......... H01L/29/786 |

OTHER PUBLICATIONS

Bohm et al;, "Czochralski growth and characteriaztion of piezoelectric single crystals with langasite structure . . . "; Mar. 1999; Journal of Crystal Growth 204 (1999) 128–136.*

"Wet Etchant for Molybdenum Having High Selectivity Against Aluminum"; Aug. 1992; IBM Technical Disclosure Bulletin.*

"Polishing and Etching Langasite and Quartz Crystals"; Sally Laffey, et al.; 1994 IEEE International Frequency Control Symposium; pp. 245–250. 12/94.

* cited by examiner

Primary Examiner—Thomas M. Dougherty
(74) Attorney, Agent, or Firm—Keating & Bennett, LLP

(57) ABSTRACT

A method for manufacturing a langasite single crystal substrate comprises the steps of polishing at least one of the main surfaces of a raw material substrate; and wet-etching said polished main surface of the substrate with a solution including $H_3PO_4$, $HNO_3$ and $CH_3COOH$.

12 Claims, 2 Drawing Sheets

METHOD FOR MANUFACTURING A LANGASITE SINGLE CRYSTAL SUBSTRATE, A LANGASITE SINGLE CRYSTAL SUBSTRATE, AND A PIEZOELECTRIC DEVICE

BACKGROUND OF THE INVENTION

1. Field of the Invention

The present invention relates to a method for manufacturing a langasite single crystal substrate, a langasite single crystal substrate, and a piezoelectric device using the substrate, such as a piezoelectric resonator and a surface acoustic wave (SAW) device.

2. Description of the Related Art

Conventionally, a single crystal substrate, including a piezoelectric substrate, is subjected mainly to wet etching after polishing for the purpose of cleaning the surface. On the other hand, a single crystal substrate material for surface acoustic wave (SAW) use is subjected to roughening the rear surface side, in order to eliminate the effects of reflection of the bulk waves at the rear surface, the waves propagating across the substrate. Thus, the difference of the states of the front and rear surfaces will cause warps. Since these warps exert influences on the cracking in the substrate or on the accuracy of photolithography in forming an electrode, the wet etching treatment is applied as a general measure to alleviate the warps of the substrate.

As an etching solution (etchant) for use in manufacturing a langasite ($La_3Ga_5SiO_{14}$) substrate, an acidic aqueous solution comprising HCl, HF and $H_2O$ is known (for example, "Etching LANGASITE and Quartz Crystals", Proceedings of the IEEE International Frequency Control Symposium (1994), pp. 245–250).

This is an aqueous solution obtained by mixing HCl, HF and $H_2O$ at a volume ratio of 1:50:150. It is heated to 70° C. for etching. It was reported that when polishing was performed using a colloidal silica, the surface state at the time of polishing treatment was maintained after etching for two hours when this etching solution was used, and a good surface state was obtained.

However, as a result of our experiments for confirming the effects of the etching method using a conventional etching solution, it was found that film was formed on the surface of a substrate, the film being supposedly made of $LaF_3$. Although some improvement was observed by increasing the amount of HCl in the etching solution, it was not possible to completely eliminate the $LaF_3$ film. Furthermore, since the etching temperature was as relatively high as 70° C., a time-based change in the compositional ratio of the etching solution occurred due to the evaporation of $H_2O$, and, therefore, it was difficult to maintain a similar etching state. Furthermore, because the etchant contains hydrofluoric acid, it was necessary to put more effort to secure safety regarding the apparatuses and the waste water treatment, resulting in more complicate handling.

SUMMARY OF THE INVENTION

Accordingly, an object of the present invention is to provide a method for manufacturing a langasite single crystal substrate which furnishes a good surface state, by an etching treatment in a short time, at a relatively low temperature and without forming a film on the substrate surface. Other objects of the present invention are to provide a langasite single crystal substrate obtained by the above-described method and to produce a piezoelectric device using it.

To achieve the above-described objectives, the method for manufacturing a langasite single crystal substrate according to the present invention comprises the step of polishing at least one of the main surfaces of a raw material substrate and the step of wet-etching the above-described main surface of the polished substrate with a solution including $H_3PO_4$, $HNO_3$ and $CH_3COOH$.

In the langasite single crystal substrate according to the present invention, at least one of the main surfaces of the single crystal substrate is wet-etched with a solution including $H_3PO_4$, $HNO_3$ and $CH_3COOH$.

A piezoelectric device according to the present invention comprises a langasite single crystal substrate, wherein at least one of the main surfaces of the single crystal substrate is wet-etched with a solution including $H_3PO_4$, $HNO_3$ and $CH_3COOH$ and comprises a transducer formed on the above-described one of the main surfaces of the single crystal substrate.

It is noted that the langasite single crystal substrate recited in the present invention is a piezoelectric single crystal substrate having a $Ca_3Ga_2Ge_4O_{14}$-type crystal structure.

According to the manufacturing method of the present invention, it is possible to obtain a langasite single crystal substrate having a good surface state by an etching treatment in a short time, at a relatively low temperature and without forming a film on the surface of a substrate. Therefore, such a langasite single crystal substrate can be used to manufacture a piezoelectric device such as a surface acoustic wave device with good properties.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, the preferred embodiments of the present invention are explained in detail with reference to the drawings.

Figure 1:
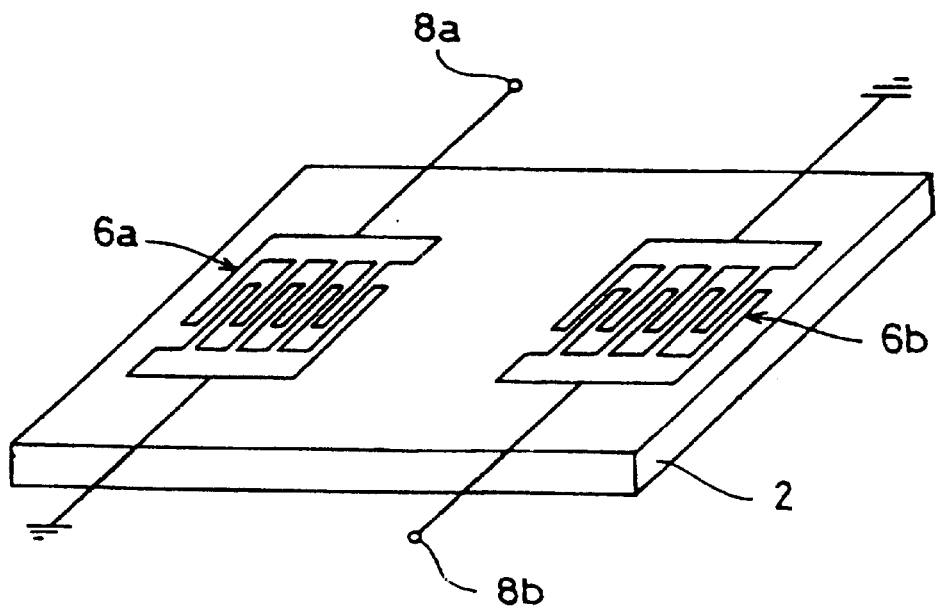
FIG. 1 is a perspective view showing one example of an SAW filter according to an embodiment of a piezoelectric device of the present invention.

FIG. 1 is a perspective view showing one example of an SAW filter according to an embodiment of a piezoelectric device of the present invention. The SAW filter 1 in FIG. 1 includes a langasite single crystal substrate 2 such as $La_3Ga_5SiO_4$. Interdigital transducers 6a and 6b are formed with an Al thin film on the surface of this langasite single crystal substrate 2. Furthermore, one interdigital transducer 6a is connected to one input/output terminal 8a and is grounded, while the other interdigital transducer 6b is connected to the other input/output terminal 8b and is also grounded. A langasite single crystal substrate according to the present invention can be used as the langasite single crystal substrate 2 of this type in an SAW filter 1.

The composition of the etching solution for use in manufacturing a langasite single crystal according to the present invention is a composition known as a wet-type etching solution for etching an Al film to form an Al electrode on the surface of a piezoelectric substrate (for example, Japanese Unexamined Patent Publications Nos. 7–50537, 10–93369, 10–135759, etc).

In our practice of designing a piezoelectricity-application device by employing a langasite single crystal, generally formed is an Al thin film in a thickness of 50–300 nm on a substrate surface and an electrode by photolithography. In the course of the manufacturing, a solution mixture consisting of $H_3PO_4$, $HNO_3$ and $CH_3COOH$ is, used as an etching solution. It was found that when a langasite substrate was immersed in this acidic solution, etching of the substrate surface occurred while keeping its mirror surface state which had been obtained by a polishing process intact. Furthermore, when a wafer with a roughened rear surface was immersed in the same way, it was observed that warps which had occurred to the wafer were alleviated in a short time.

Each of $H_3PO_4$, $HNO_3$ and $CH_3COOH$ constituting the etching solution according to the present invention can etch a langasite substrate. While with $H_3PO_4$ and $HNO_3$, etching proceeds very rapidly at a relatively low temperature, conspicuous unevenness will appear on the surface, preventing one from obtaining a smooth surface state. With $CH_3COOH$, etching can proceed with a relatively low speed, and yet fails to provide a smooth surface state. However, the etching solution according to the present invention can provide a good surface state by controlling the etching speed at an adequate value through mixing $HNO_3$ and $CH_3COOH$ in a base solution of $H_3PO_4$ having a very large etching speed. In general, it is preferable that the etching solution comprises about 50 to 90 vol. % of $H_3PO_4$, about 70 to 80 vol. % of $HNO_3$ and about 6 10 vol. % of $CH_3COOH$.

Working Examples

First, an $La_3Ga_5SiO_{14}$ single crystal was selected as a langasite single crystal. One such single crystal grown along the <001>axis direction and having a diameter of 84 mm was vertically cut along the crystal growth axis with an inner peripheral blade slicing machine into slices having a thickness of 0.6 mm, followed by an edge surface processing to prepare a disc substrate with a diameter of 76.2 mm. This substrate was subjected to a dual side polishing processing using a dual surface lapping apparatus and using abrasive grains GC #1,000 to obtain a thickness of 0.4 mm. Only one of the surfaces of this substrate was subjected to mechanochemical polishing using a colloidal silica to realize a finishing thickness of 0.35 mm. At this point, the warpage of the $La_3Ga_5SiO_{14}$ single crystal substrate was about 0.15 mm at its maximum, caused by the convex profile toward the polished surface side.

Next, a solution obtained by mixing $H_3PO_4$, $HNO_3$ and $CH_3COOH$, each of special grade (99% purity or more), at a volume ratio shown for Sample 1 or Sample 2 in Table 1 was put in a vessel and heated to 40° C. in a thermostat. When the solution temperature became constant, the above-described $La_3Ga_5SiO_{14}$ single crystal substrate which had been preheated at 40° C. was immersed in the solution for minutes for etching. Then, it was subjected to cleansing with a 5% HCl aqueous solution at room temperature, followed by washing with running water.

As a result, the warpage was 0.02 mm or less throughout the substrate surface after the 10 minute etching, resulting in an improved warpage, a level which does not pose any problem in practice. Furthermore, regarding the surface state, there was no film formed on the substrate surface and the surface state obtained at the polishing was maintained, which was different from the case in which the conventional HF—HCl—$H_2O$ type etching solution was used. The results are shown in Table 1.

TABLE 1

|  | Working Example | | Comparative Example | | |
|---|---|---|---|---|---|
| Component | Sample 1 | Sample 2 | Sample 3 | Sample 4 | Sample 5 |
| $H_3PO_4$ | 11 | 16 | 0 | 0 | 0 |
| $HNO_3$ | 3 | 1 | 0 | 0 | 0 |
| $CH_3COOH$ | 1 | 2 | 0 | 0 | 0 |
| HF | 0 | 0 | 1 | 1 | 1 |
| HCl | 0 | 0 | 50 | 5 | 1 |
| $H_2O$ | 0 | 1 | 150 | 15 | 3 |
| Surface Warpage | 0.02 mm | 0.02 mm | 0.05 mm | 0.07 mm | 0.07 mm |
| Surface State | Excellent | Good | Poor | Poor | Poor |
| Remarks |  |  | Film formed | Film formed | Film formed |

Note:
Each value in the cells indicates a volume rate of each component.

Figure 2:
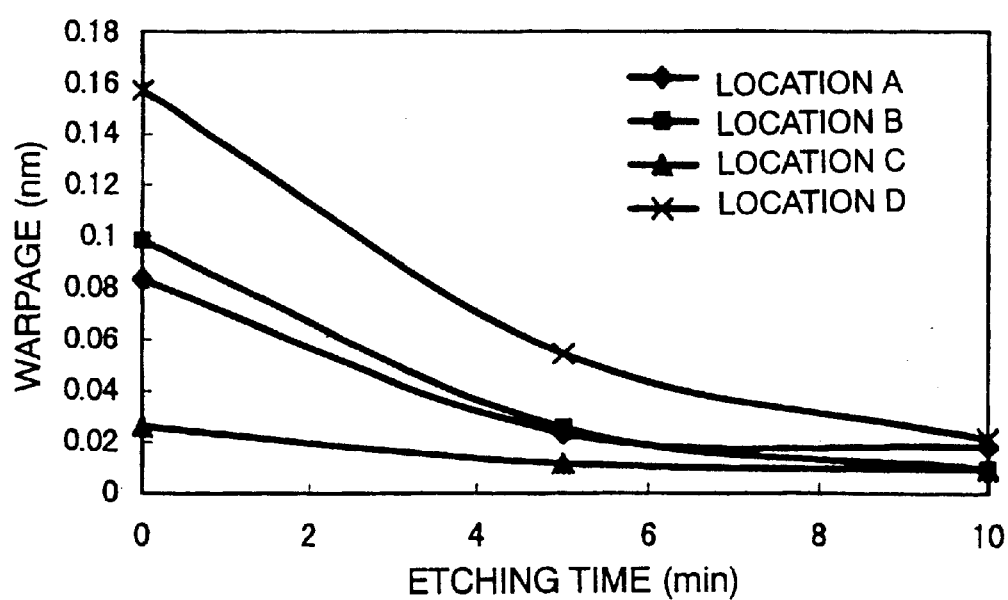
FIG. 2 is a graph showing the relationship between the etching time and the surface warpage of a substrate in the present invention.
Figure 3:
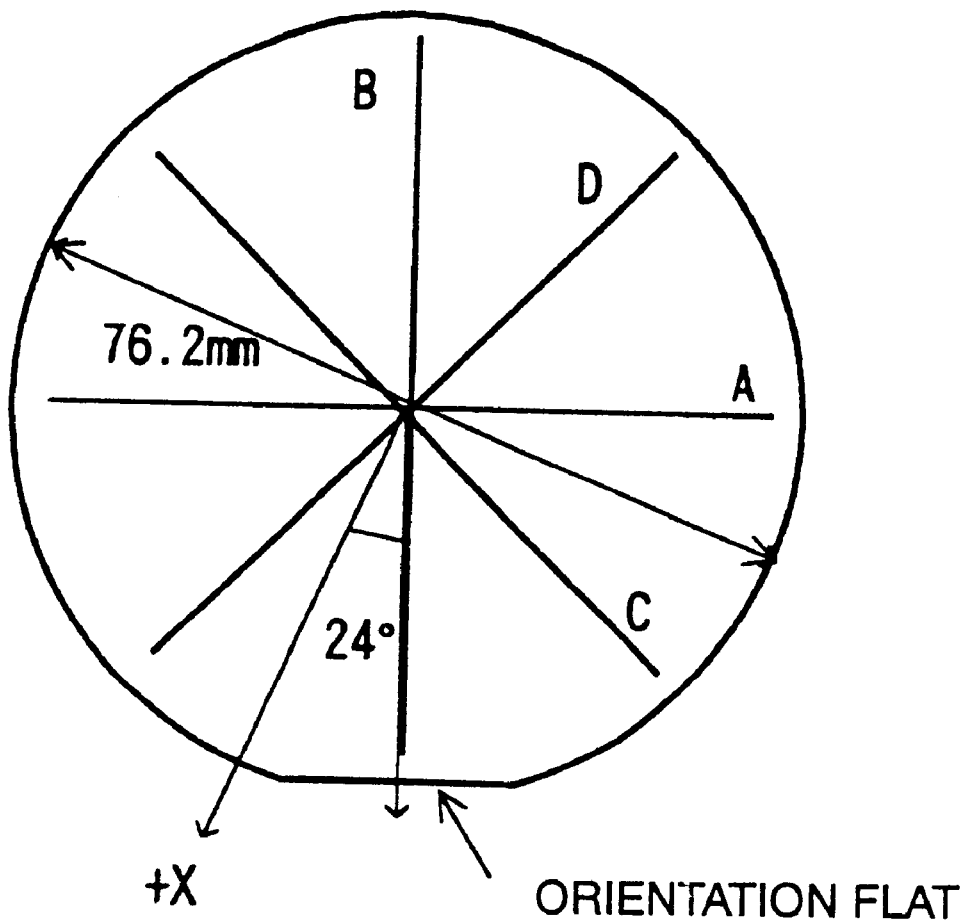
FIG. 3 is a top view of a single crystal substrate according to the present Examples, showing the scanning direction of a surface roughness meter at the time of measuring the warpage of a substrate.

It is noted that the surface warpage in Table 1 was a result of scanning with a surface roughness meter along the direction of the diameter on the surface of a single crystal substrate which had been subjected to an etching treatment. FIG. 2 shows the relationship between the etching time and the surface warpage of the substrate in Sample 1. The legends location A, location B, location C, and location D in FIG. 2 indicate warpage toward lines A, B, C and D respectively in a top view of a single crystal substrate shown in FIG. 3.

Also, the surface state in Table 1 was determined depending on the surface flatness and whether there was a film or deposits, from the observation of a single crystal substrate surface obtained by the etching treatment, with a differential interference microscope. The term, "Excellent" represents the state that neither surface unevenness nor film nor deposits were observed, the term "Good" represents the state that there were neither film nor deposits observed while there was slight surface unevenness observed, and the "Poor" represents the state that there were both surface unevenness and deposits observed.

Comparative Examples

The dual side polishing treatment and the mechanochemical polishing treatment were performed in the same way as in the Working Example. An $La_3Ga_5SiOl_4$ single crystal with a diameter of 76.2 mm thus obtained was subjected to etching with etching solutions obtained by mixing ffF, HCl and $H_2O$ at the HF:HCl:$H_2O$ volume ratios shown in Table 1 for Samples 3 to 5. It is noted that the etching was performed as follows: an etching solution was put into a vessel and was heated to 70° C. in a thermostat; when the solution temperature became constant, the above-described $La_3Ga_5SiO_{14}$ single crystal substrate which had been preheated at 70° C. was immersed in the solution for one hour for etching; and then it was subjected to cleansing with a 5% HCl aqueous solution at room temperature followed by washing with running water.

Next, the warpage and the surface state of single crystal substrates obtained by the etching treatment were observed as in the case of the Working Example 1. The results are shown in Table 1.

As shown in Table 1, a film was formed on the surface of an $La_3Ga_5SiO_{14}$ single crystal substrate in each Comparative Example, and a phenomenon that cracks appeared as the substrates were dried was observed. Furthermore, the surface state of the substrates which had been obtained by the polishing processing could not be maintained.

Although in the above-described Examples, explanations were made based on the case in which the langasite single crystal was an $La_3Ga_5SiO_{14}$ single crystal, a piezoelectric single crystal having a $Ca_3Ga_2Ge_4O_{14}$-type crystal structure, such as one composed of at least three elements selected from the group consisting of La, Ba, Sr, Ga, Ge, Si, Al, Ti, Nb, and Ta, provides the same effect as a langasite single crystal.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method for manufacturing a langasite single crystal substrate having at least one surface comprising the steps of:
   polishing a surface of the substrate; and
   wet-etching said polished surface of the substrate with a solution comprising $H_3PO_4$, $HNO_3$ and $CH_3COOH$.

2. A method for manufacturing a langasite single crystal substrate according to claim 1, wherein said substrate has a pair of main surfaces and each of said main surfaces is polished and wet-etched.

3. A method for manufacturing a langasite single crystal substrate according to claim 2, wherein said solution comprises about 5 to 10 vol. % $HNO_3$ and about 5 to 10 vol. % $CH_3COOH$.

4. A method for manufacturing a langasite single crystal substrate according to claim 1, wherein said solution comprises about 5 to 10 vol. % $HNO_3$ and about 5 to 10 vol. % $CH_3COOH$.

5. A langasite single crystal substrate having a surface of the single crystal substrate polished and wet-etched with a solution comprising $H_3PO_4$, $HNO_3$ and $CH_3COOH$.

6. A langasite single crystal substrate according to claim 5, wherein said substrate has a pair of main surfaces and each of said main surfaces is polished and wet-etched.

7. A langasite single crystal substrate made by the method of claim 1.

8. A langasite single crystal substrate made by the method of claim 2.

9. A piezoelectric device comprising:
   a langasite single crystal substrate having a first surface of the single crystal substrate polished and wet-etched with a solution comprising $H_3PO_4$, $HNO_3$ and $CH_3COOH$; and
   a transducer on said surface of the single crystal substrate.

10. The piezoelectric device according to claim 9 having a second surface polished and wet-etched with said solution.

11. A piezoelectric device comprising:
    a langasite single crystal substrate made by the method of claim 1 and having a transducer on said surface of the single crystal substrate.

12. The piezoelectric device according to claim 11, wherein the langasite single crystal substrate has a second surface polished and wet-etched with said solution.

* * * * *